(12) United States Patent
Liao

(10) Patent No.: US 12,308,280 B2
(45) Date of Patent: May 20, 2025

(54) METHOD OF MANUFACTURING SEMICONDUCTOR STRUCTURE HAVING FINS

(71) Applicant: NANYA TECHNOLOGY CORPORATION, New Taipei (TW)

(72) Inventor: Chen-Tsung Liao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 415 days.

(21) Appl. No.: 17/573,787

(22) Filed: Jan. 12, 2022

(65) Prior Publication Data

US 2023/0223298 A1  Jul. 13, 2023

(51) Int. Cl.
*H01L 21/762* (2006.01)
*H01L 21/3065* (2006.01)
*H01L 21/311* (2006.01)
*H10D 30/01* (2025.01)

(52) U.S. Cl.
CPC .... *H01L 21/76232* (2013.01); *H01L 21/3065* (2013.01); *H01L 21/31116* (2013.01); *H10D 30/024* (2025.01)

(58) Field of Classification Search
None
See application file for complete search history.

(56) References Cited

U.S. PATENT DOCUMENTS

| | | | |
|---|---|---|---|
| 9,620,503 B1* | 4/2017 | Liao | H10D 30/797 |
| 9,793,174 B1* | 10/2017 | Huang | H10D 30/024 |
| 2008/0251849 A1 | 10/2008 | Yamagami et al. | |
| 2013/0093026 A1* | 4/2013 | Wann | H10D 84/0158 257/E27.06 |
| 2014/0377928 A1* | 12/2014 | Hu | H10D 84/0151 438/381 |
| 2015/0145068 A1* | 5/2015 | Chen | H01L 29/66795 257/401 |
| 2015/0187634 A1 | 7/2015 | Chang et al. | |

(Continued)

FOREIGN PATENT DOCUMENTS

| | | |
|---|---|---|
| CN | 108109994 A | 6/2018 |
| TW | 201926717 A | 7/2019 |

(Continued)

OTHER PUBLICATIONS

An Office Action in corresponding U.S. Appl. No. 17/573,759 dated Jul. 12, 2023 is attached, 21 pages.

(Continued)

*Primary Examiner* — Khaja Ahmad
(74) *Attorney, Agent, or Firm* — MUNCY, GEISSLER, OLDS & LOWE, P.C.

(57) ABSTRACT

The present disclosure provides a method of manufacturing a semiconductor structure having fins. The method includes providing a semiconductor substrate including a plurality of initial fin structures. The method also includes forming an isolation material covering the plurality of initial fin structures. The method further includes performing an anisotropic etching operation on the isolation material and the plurality of initial fin structures to form a plurality of fins. The method also includes performing an isotropic etching operation on the isolation material to form an isolation structure surrounding the plurality of fins.

8 Claims, 17 Drawing Sheets

(56) References Cited

U.S. PATENT DOCUMENTS

| | | | |
|---|---|---|---|
| 2017/0005014 A1 | 1/2017 | Yamashita et al. | |
| 2018/0145072 A1 | 5/2018 | Kim et al. | |
| 2018/0226403 A1* | 8/2018 | Chen | H01L 29/0649 |
| 2018/0315753 A1* | 11/2018 | Balakrishnan | H01L 21/3086 |
| 2019/0043857 A1 | 2/2019 | Wu et al. | |
| 2020/0075342 A1* | 3/2020 | Chen | H01L 21/76229 |
| 2021/0257462 A1 | 8/2021 | Lu et al. | |
| 2022/0130978 A1* | 4/2022 | Lin | H01L 29/785 |

FOREIGN PATENT DOCUMENTS

| | | |
|---|---|---|
| TW | 1724456 B | 4/2021 |
| TW | I724456 B | 4/2021 |
| TW | 202145571 A | 12/2021 |
| TW | 202147523 A | 12/2021 |

OTHER PUBLICATIONS

Taiwanese Office Action dated Feb. 20, 2023 in application No. 111118270 and the search report attached to the Office Action; pp. 1-4.
U.S. Office Action dated Apr. 25, 2023 in U.S. Appl. No. 17/573,759 and the search report attached to the Office Action; pp. 1-16.
An Office Action in corresponding TW Application No. 111118270 dated Nov. 12, 2024 is attached, 9 pages.

* cited by examiner

METHOD OF MANUFACTURING SEMICONDUCTOR STRUCTURE HAVING FINS

TECHNICAL FIELD

The present disclosure relates to a method of manufacturing a semiconductor structure, and more particularly, to a method of manufacturing a semiconductor structure having one or more fins.

DISCUSSION OF THE BACKGROUND

With the rapid growth of electronic industry, the development of semiconductor devices has achieved high performance and miniaturization. As the size of semiconductor devices, such as dynamic random access memory (DRAM) devices, is reduced, line widths of conductive features within the semiconductor devices are reduced, which may increase the manufacturing difficulty and reduce the manufacturing yield.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure including a semiconductor substrate and an isolation structure. The semiconductor substrate includes a first fin. The isolation structure defines the first fin. The isolation structure includes a first portion and a second portion on two opposite sides of the first fin. A difference between an elevation of a top surface of the first portion and an elevation of a top surface of the second portion is greater than 0 and less than about 5 nm.

Another aspect of the present disclosure provides a method of manufacturing a semiconductor structure. The method includes providing a semiconductor substrate including a plurality of initial fin structures. The method also includes forming an isolation material covering the plurality of initial fin structures. The method further includes performing an anisotropic etching operation on the isolation material and the plurality of initial fin structures to form a plurality of fins. The method also includes performing an isotropic etching operation on the isolation material to form an isolation structure surrounding the plurality of fins.

Another aspect of the present disclosure provides a method of manufacturing a semiconductor structure. The method includes providing a semiconductor substrate including a plurality of initial fin structures. The method also includes forming an isolation material covering the plurality of initial fin structures. The method further includes performing a first removal operation on the plurality of initial fin structures and the isolation material to form a plurality of fins and an isolation layer surrounding the plurality of fins. An elevational difference between a top surface of the plurality of fins and a top surface of the isolation layer is less than about 10 nm. The method also includes performing a second removal operation on the isolation layer to form an isolation structure surrounding the plurality of fins, wherein a top surface of the isolation structure is below the top surface of the plurality of fins by about 20 nm to about 40 nm.

In the method of manufacturing the semiconductor structure, the formation of fins and an isolation structure defining the fins includes a dry etching operation for removing relatively large portions of initial fin structures and an isolation material and a wet etching operation for further removing a portion of the isolation material (or the isolation layer) to define the fin height. The flowability of the liquid phase of an etchant of the wet etching operation can allow the etchant to penetrate through small features (e.g., the isolation portion between two fins that are relatively close to each other). Therefore, the etching uniformity is significantly increased, and thus the isolation portions between fins can be etched away by substantially equal heights or amounts, thereby the uniformity of the as-formed fin heights can be significantly increased. In addition, the time period for performing the wet etching can be relatively short, and over-etching of structures and/or elements other than the isolation material (or the isolation layer) can be further prevented.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
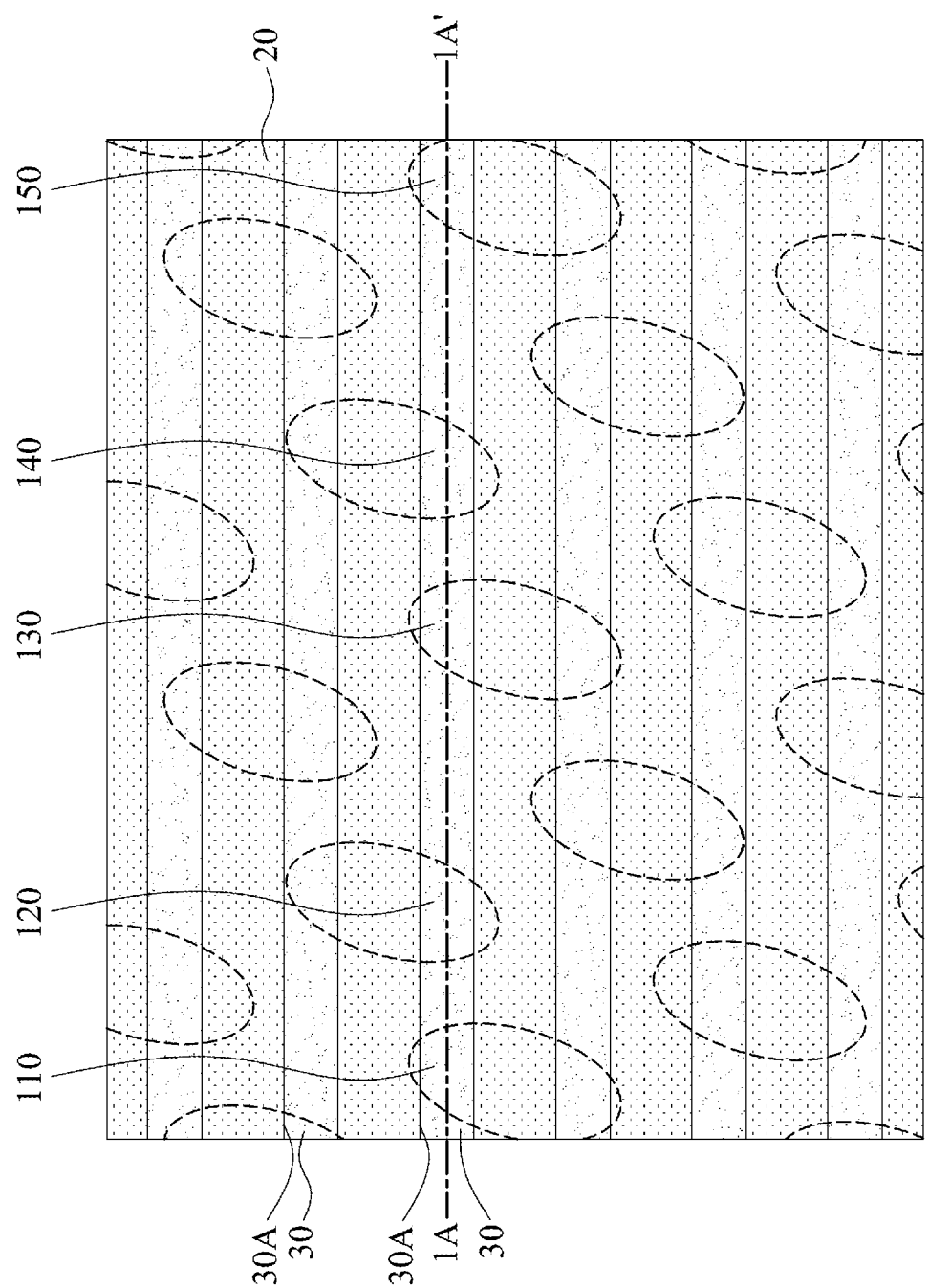
FIG. 1 is a top view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1A:
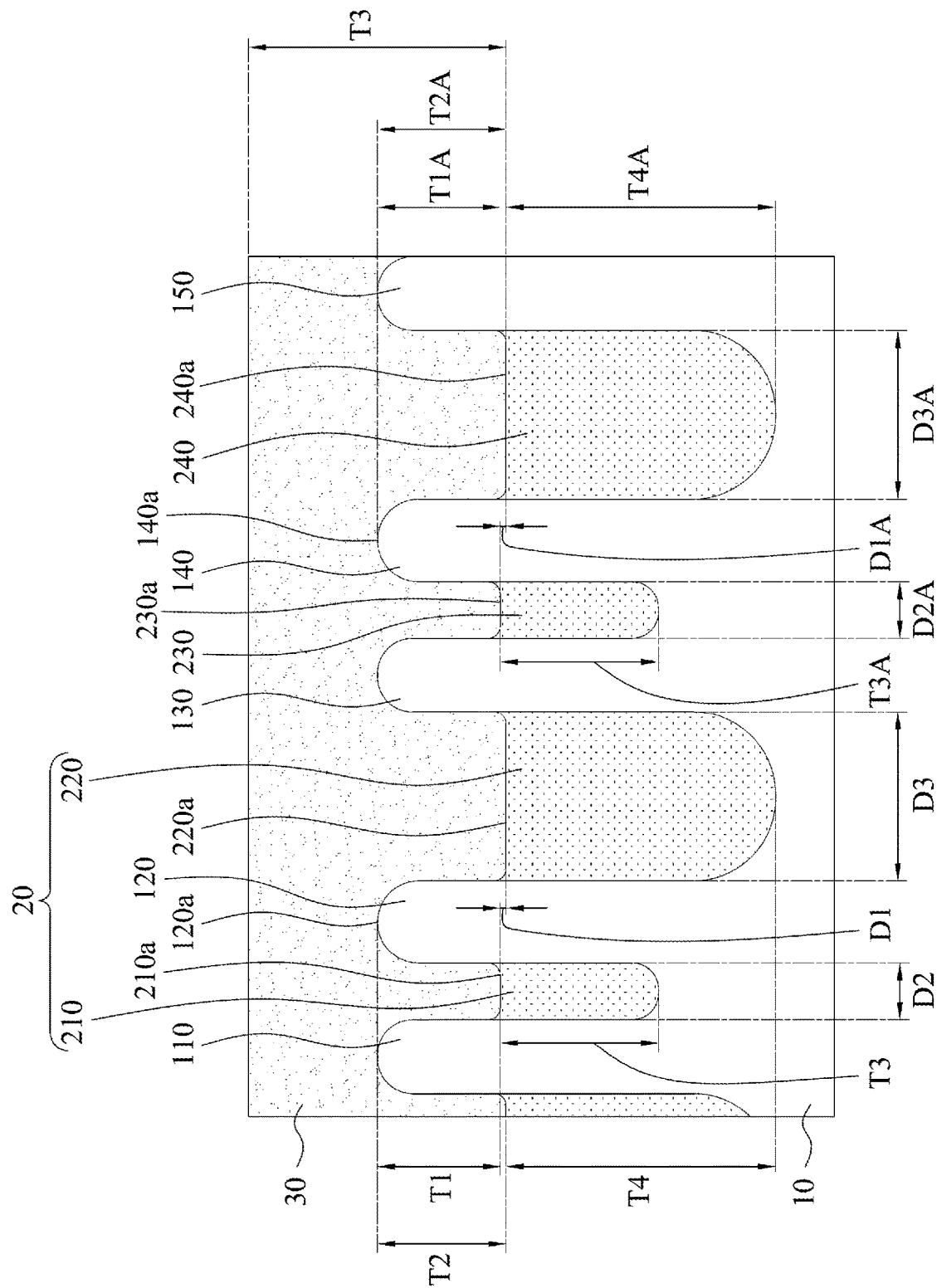
FIG. 1A is a cross-section of a semiconductor structure, in accordance with some embodiments of the present disclosure.

FIG. 1 is a top view of a semiconductor structure 1, in accordance with some embodiments of the present disclosure, and FIG. 1A is a cross-section of a semiconductor structure 1, in accordance with some embodiments of the present disclosure. In some embodiments, FIG. 1A is a cross-section along the cross-sectional line 1A-1A' of FIG. 1. The semiconductor structure 1 includes a semiconductor substrate 10, an isolation structure 20, and one or more conductive elements 30. It should be noted that some elements may be omitted for clarity.

The semiconductor substrate 10 may include one or more active regions. The semiconductor substrate 10 may include one or more fins (e.g., fins 110, 120, 130, 140, and 150). The active regions of the semiconductor substrate 10 may include the fins and doped regions. The doped regions may be source/drain regions. The number of the fins of the semiconductor substrate 10 may vary according to actual applications and is not limited thereto.

In some embodiments, the fins 110, 120, 130, 140, and 150 of the semiconductor substrate 10 are adjacent to and defined by the isolation structure 20. In some embodiments, the fins 110, 120, 130, 140, and 150 are separated from each other by portions of the isolation structure 20. In some embodiments, a distance D2 between the fin 110 and the fin 120 is less than a distance D3 between the fin 120 and the fin 130. In some embodiments, a distance D2A between the fin 130 and the fin 140 is less than a distance D3A between the fin 150 and the fin 130. In some embodiments, the distance D2 is substantially equal to the distance D2A. In some embodiments, the distance D3 is substantially equal to the distance D3A. The semiconductor substrate 10 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. In some embodiments, the fins 110, 120, 130, 140, and 150 of the semiconductor substrate 10 may be formed of or include one or more silicon-containing materials, for example, silicon, doped silicon, or silicon germanium.

The isolation structure 20 may define the fins 110, 120, 130, 140, and 150 of the semiconductor substrate 10. The isolation structure 20 may be formed of or include an insulating material such as silicon oxide, silicon nitride, silicon oxynitride, or a combination thereof.

In some embodiments, the isolation structure 20 includes a plurality of portions adjacent to the fins 110, 120, 130, 140, and 150. In some embodiments, the isolation structure 20 includes a portion 210 a portion 220 on two opposite sides of the fin 120. In some embodiments, the fin 110 is separated from the fin 120 by the portion 210 of the isolation structure 20. In some embodiments, the fin 130 is separated from the fin 120 by the portion 220 of the isolation structure 20. In some embodiments, a width (e.g., the distance D2) of the portion 210 of the isolation structure 20 is less than a width (e.g., the distance D3) of the portion 220 of the isolation structure 20. In some embodiments, a thickness T3 of the portion 210 of the isolation structure 20 is less than a thickness T4 of the portion 220 of the isolation structure 20.

In some embodiments, the isolation structure 20 further includes a portion 230 a portion 240 on two opposite sides of the fin 140. In some embodiments, the fin 130 is separated from the fin 140 by the portion 230 of the isolation structure 20. In some embodiments, the fin 150 is separated from the fin 140 by the portion 240 of the isolation structure 20. In some embodiments, a width (e.g., the distance D2A) of the portion 230 of the isolation structure 20 is less than a width (e.g., the distance D3A) of the portion 240 of the isolation structure 20. In some embodiments, a thickness TA3 of the portion 230 of the isolation structure 20 is less than a thickness T4A of the portion 240 of the isolation structure 20. In some embodiments, the thickness T3 is substantially equal to the thickness T3A. In some embodiments, the thickness T4 is substantially equal to the thickness T4A.

In some embodiments, a difference D1 between an elevation of a top surface 210a of the portion 210 and an elevation of a top surface 220a of the portion 220 is greater than 0 and less than about 5 nm. In some embodiments, the difference D1 between an elevation of a top surface 210a of the portion 210 and an elevation of a top surface 220a of the portion 220 is equal to or less than about 3 nm. In some embodiments, the difference D1 between an elevation of a top surface 210a of the portion 210 and an elevation of a top surface 220a of the portion 220 is equal to or less than about 2 nm. In some embodiments, the difference D1 between an elevation of a top surface 210a of the portion 210 and an elevation of a top surface 220a of the portion 220 is equal to or less than about 1 nm.

In some embodiments, a difference D1A between an elevation of a top surface 230a of the portion 230 and an elevation of a top surface 240a of the portion 240 is greater than 0 and less than about 5 nm. In some embodiments, the difference D1A between an elevation of a top surface 230a of the portion 230 and an elevation of a top surface 240a of the portion 240 is equal to or less than about 3 nm. In some embodiments, the difference D1A between an elevation of a top surface 230a of the portion 230 and an elevation of a top surface 240a of the portion 240 is equal to or less than about 2 nm. In some embodiments, the difference D1A between an elevation of a top surface 230a of the portion 230 and an elevation of a top surface 240a of the portion 240 is equal to or less than about 1 nm. In some embodiments, the distance D1 is substantially equal to the distance D1A.

In some embodiments, a distance T1 between a top surface 120a of the fin 120 and the top surface 210a of the portion 210 of the isolation structure 20 is less than a distance T2 between the top surface 120a of the fin 120 and the top surface 220a of the portion 220 of the isolation structure 20. In some embodiments, the elevation of the top surface 210a of the portion 210 is higher than the elevation of the top surface 220a of the portion 220.

In some embodiments, a distance T1A between a top surface 140a of the fin 140 and the top surface 230a of the portion 230 of the isolation structure 20 is less than a distance T2A between the top surface 140a of the fin 140 and the top surface 240a of the portion 240 of the isolation structure 20. In some embodiments, the elevation of the top surface 230a of the portion 230 is higher than the elevation of the top surface 240a of the portion 240. In some embodiments, the distance T1 is substantially equal to the distance T1A. In some embodiments, the distance T2 is substantially equal to the distance T2A.

The conductive element 30 may be disposed on the semiconductor substrate 10 and the isolation structure 20. In some embodiments, the semiconductor substrate 10 and the isolation structure 20 collectively define one or more trenches 30A, and the fins 110, 120, 130, 140, and 150 are in the trenches 30A. In some embodiments, the conductive element 30 is disposed on the fins 110, 120, 130, 140, and 150 in the trench 30A. In some embodiments, the conductive element 30 is conformally formed on the fins 110, 120, 130, 140, and 150 in the trench 30A. In some embodiments, the semiconductor structure 1 includes a plurality of conductive elements 30 in a plurality of trenches 30A. In some embodiments, the conductive element 30 includes a conductive material, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the conductive elements 30 may be or include word lines.

In some embodiments, the fin height of the fins 110, 120, 130, 140, and 150 in the trench 30A is defined by the elevational difference between the fins 110, 120, 130, 140, and 150 and the isolation structure 20. According to some embodiments of the present disclosure, despite the loading effects that may occur when the distance D2 between the fin 110 and the fin 120 is smaller than the distance D3 between the fin 120 and the fin 130, the elevational difference D1 between the portion 210 and the portion 220 of the isolation structure 20 is relatively small, and thus the fin heights are relatively uniform. Therefore, the semiconductor structure 1 can avoid including a region where two fins are relatively close to each other and the isolation portion formed therebetween undesirably reduces the fin heights. Therefore, the semiconductor structure 1 (e.g., the transistors including the fins) can have a satisfactory performance, for example, having a satisfactory on-off sensitivity and/or functions.

FIG. 2, FIG. 2A, FIG. 2B, FIG. 3, FIG. 3A, FIG. 3B, FIG. 4, FIG. 4A, FIG. 4B, FIG. 5, FIG. 5A, FIG. 5B illustrate various stages of a method of manufacturing a semiconductor structure 1, in accordance with some embodiments of the present disclosure.

Figure 2:
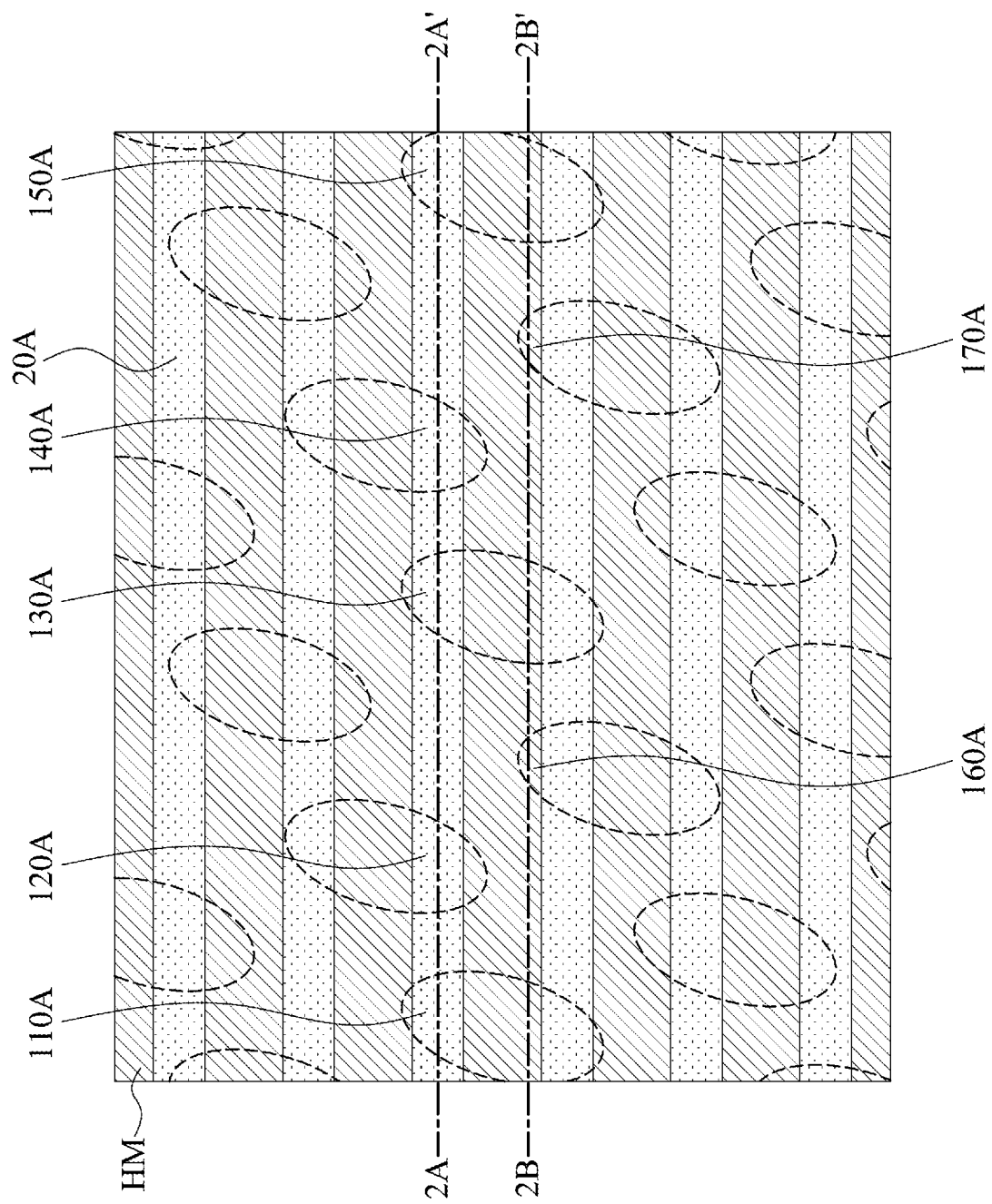
FIG. 2 is a top view illustrating one stage of a method of manufacturing a semiconductor structure, in accordance with some embodiments of the present disclosure.
Figure 2A:
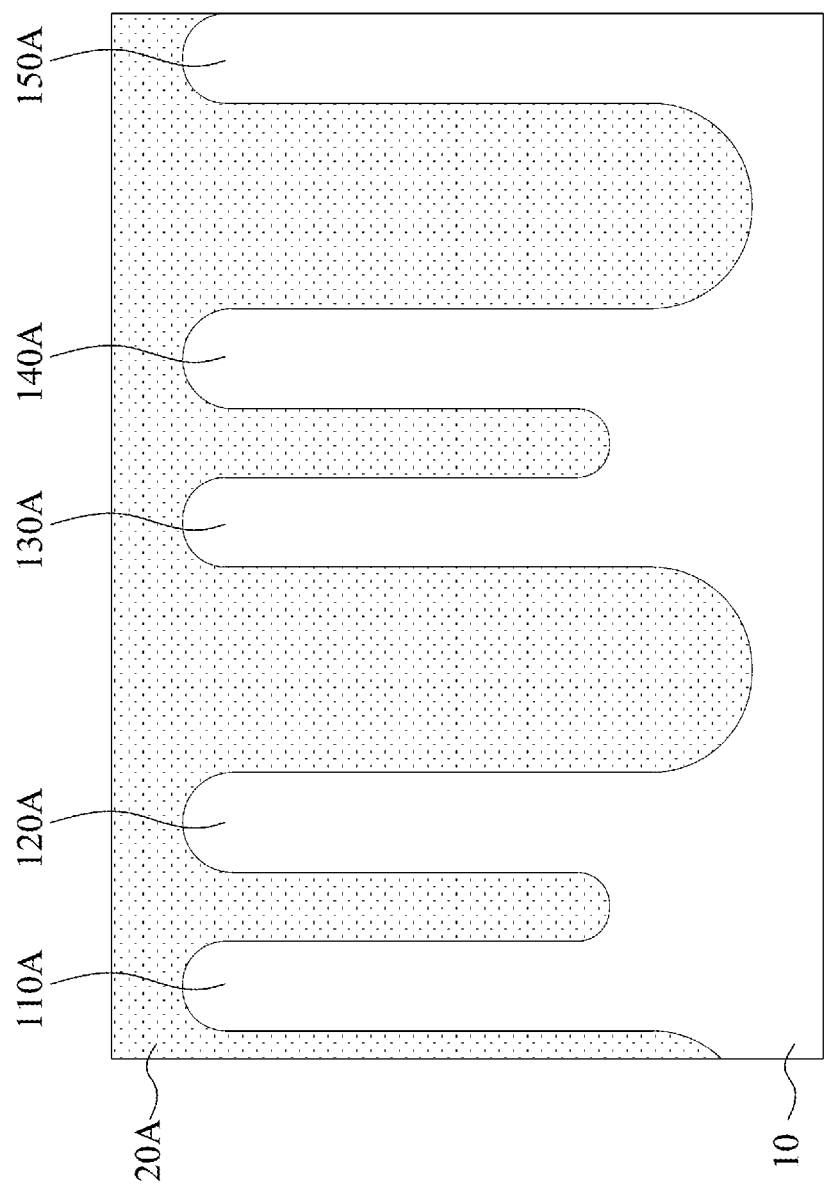
FIG. 2A is a cross-section illustrating one stage of a method of manufacturing a semiconductor structure, in accordance with some embodiments of the present disclosure.
Figure 2B:
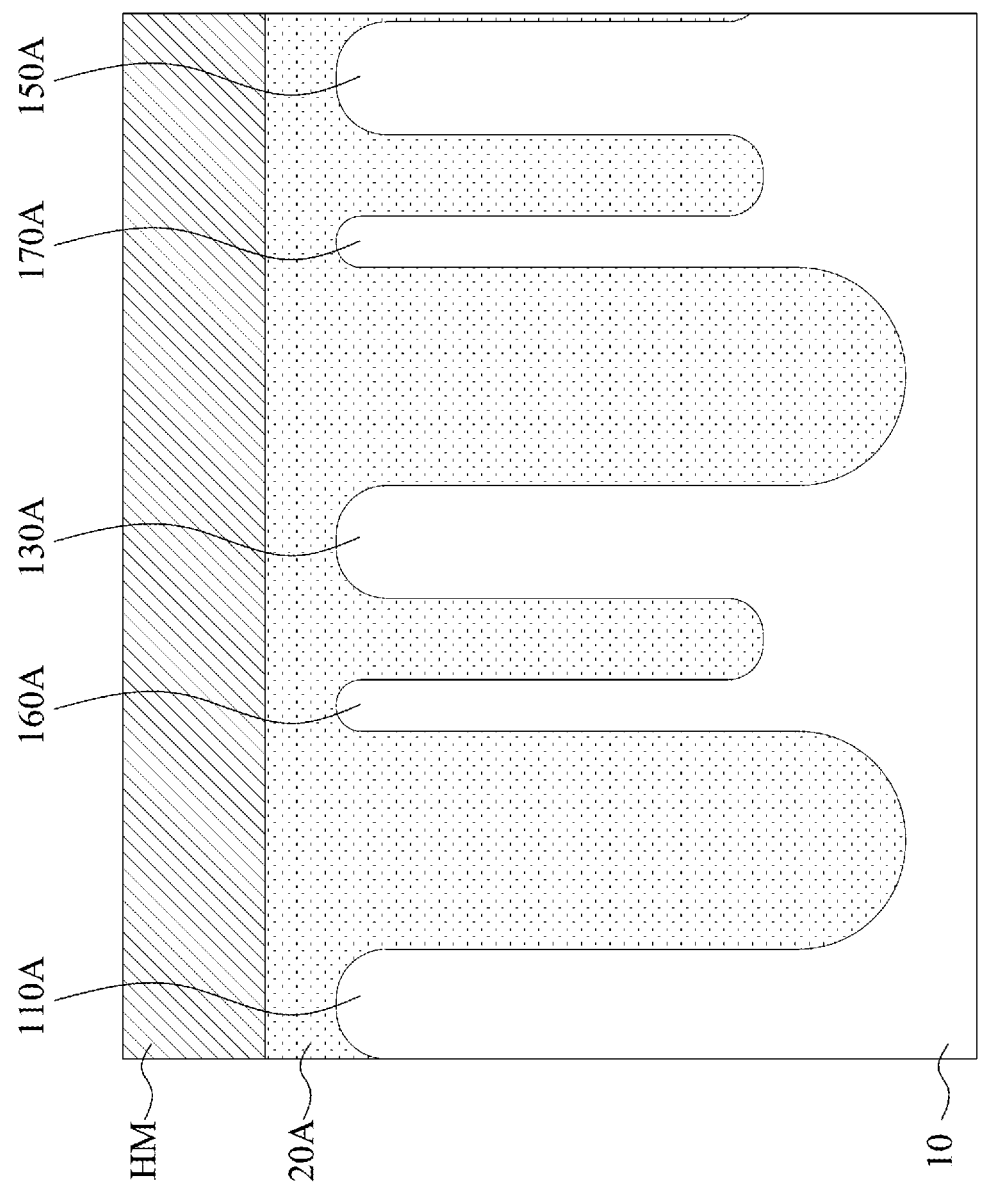
FIG. 2B is a cross-section illustrating one stage of a method of manufacturing a semiconductor structure, in accordance with some embodiments of the present disclosure.

Referring to FIGS. 2, 2A, and 2B, FIG. 2 is a top view illustrating one stage of a method of manufacturing a semiconductor structure 1, in accordance with some embodiments of the present disclosure, FIG. 2A is a cross-section illustrating one stage of a method of manufacturing a semiconductor structure 1, in accordance with some embodiments of the present disclosure, and FIG. 2B is a cross-section illustrating one stage of a method of manufacturing a semiconductor structure 1, in accordance with some embodiments of the present disclosure. In some embodiments, FIG. 2A is a cross-section along line 2A-2A' of FIG. 2, and FIG. 2B is a cross-section along line 2B-2B' of FIG. 2.

A semiconductor substrate 10 including a plurality of initial fin structures (e.g., initial fin structures 110A, 120A, 130A, 140A, 150A, 160A, and 170A) may be provided. The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. The number of the initial fin structures of the semiconductor substrate 10 may vary according to actual applications and is not limited thereto.

Photolithography may be performed to pattern the semiconductor substrate 10 to define positions of the plurality of initial fin structures 110A, 120A, 130A, 140A, 150A, 160A, and 170A. Etching may be performed after the photolithography process to form a plurality of trenches in the semiconductor substrate 10.

After etching to form the plurality of trenches in the semiconductor substrate 10, an isolation material 20A may be formed to cover the plurality of initial fin structures 110A, 120A, 130A, 140A, 150A, 160A, and 170A. The isolation material 20A may be used to fill the plurality of trenches of the semiconductor substrate 10 by deposition. The insulating material 20A may include such as silicon oxide, silicon nitride, silicon oxynitride, or a combination thereof.

A patterned hard mask HM may be disposed over the isolation material 20A and the initial fin structures 110A, 120A, 130A, 140A, 150A, 160A, and 170A of the semiconductor substrate 10. A hard mask may be deposited over the isolation material 20A and the initial fin structures 110A, 120A, 130A, 140A, 150A, 160A, and 170A of the semiconductor substrate 10, and then the hard mask may be patterned according to a patterned photoresist layer to form the patterned hard mask HM having a plurality of openings to expose portions of the isolation material 20A and the initial fin structures 110A, 120A, 130A, 140A, 150A, 160A, and 170A of the semiconductor substrate 10. The patterned hard mask HM may have a predetermined pattern for forming a plurality of trenches (e.g., trenches 30A where conductive elements 30 are formed subsequently, which will be discussed hereinafter) passing through the isolation material 20A and the initial fin structures 110A, 120A, 130A, 140A, 150A, 160A, and 170A of the semiconductor substrate 10. The openings of the patterned hard mask HM correspond to the locations where the trenches (e.g., the trenches 30A where conductive elements 30 are formed) passing through the isolation material 20A and the initial fin structures 110A, 120A, 130A, 140A, 150A, 160A, and 170A of the semiconductor substrate 10.

In some embodiments, the patterned hard mask HM may include a dual-anti-reflective coating (DARC), a carbon layer on the DARC, and a nitride layer on the carbon layer. The DARC and the carbon layer may be patterned according to a patterned photoresist layer to transfer a predetermined pattern from the patterned photoresist layer to the DARC and the carbon layer. Next, the patterned photoresist layer may be removed, and the nitride layer may be patterned according to the patterned DARC and the patterned carbon layer to transfer the predetermined pattern from the DARC and the carbon layer to the nitride layer. In some embodiments, the patterned DARC, the patterned carbon layer, and the patterned nitride layer collectively form the patterned hard mask HM.

In some embodiments, FIG. 2A is the cross-section where the opening of the patterned hard mask HM is located, and FIG. 2B is the cross-section where the patterned hard mask HM is located.

Figure 3:
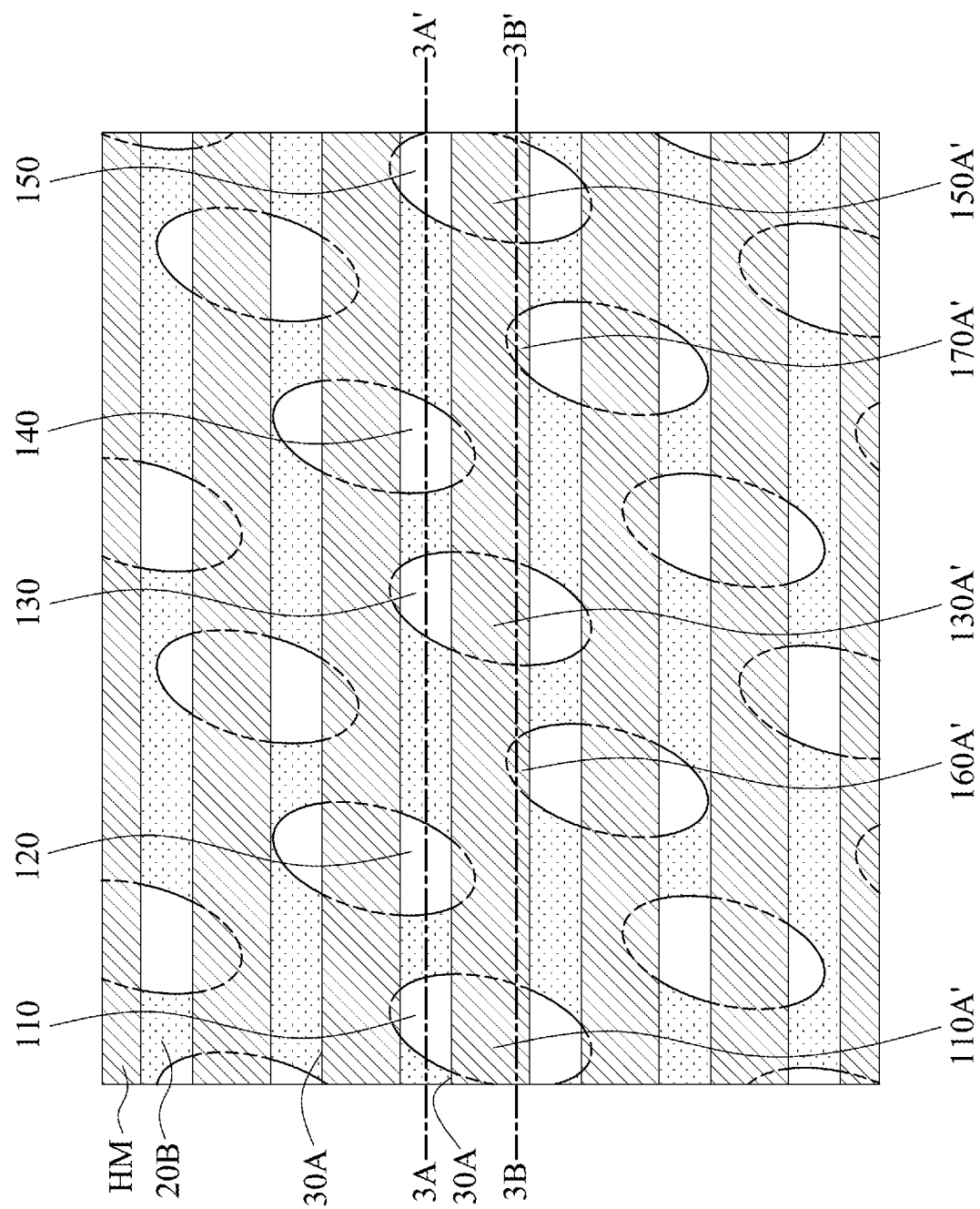
FIG. 3 is a top view illustrating one stage of a method of manufacturing a semiconductor structure, in accordance with some embodiments of the present disclosure.
Figure 3A:
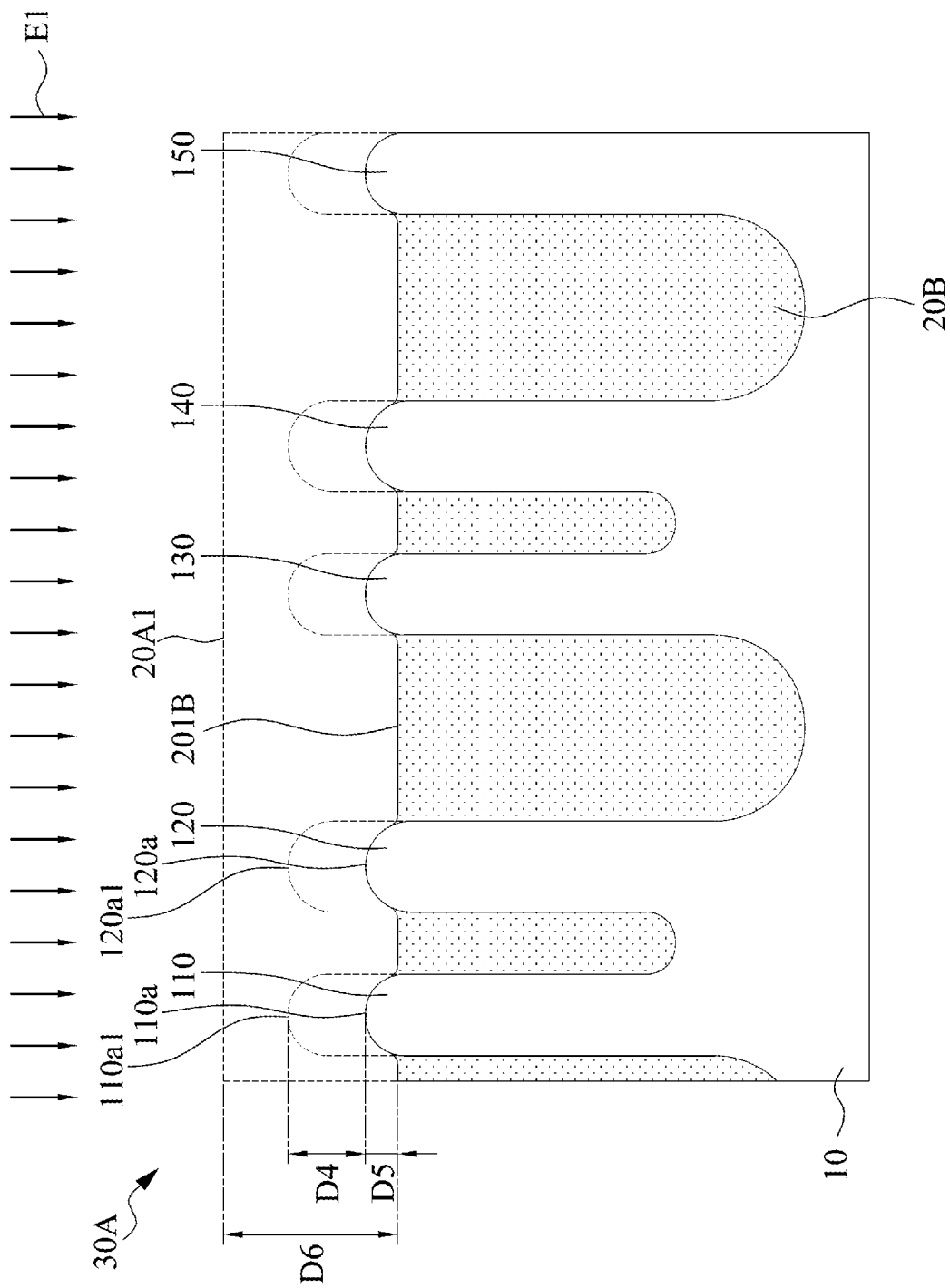
FIG. 3A is a cross-section illustrating one stage of a method of manufacturing a semiconductor structure, in accordance with some embodiments of the present disclosure.
Figure 3B:
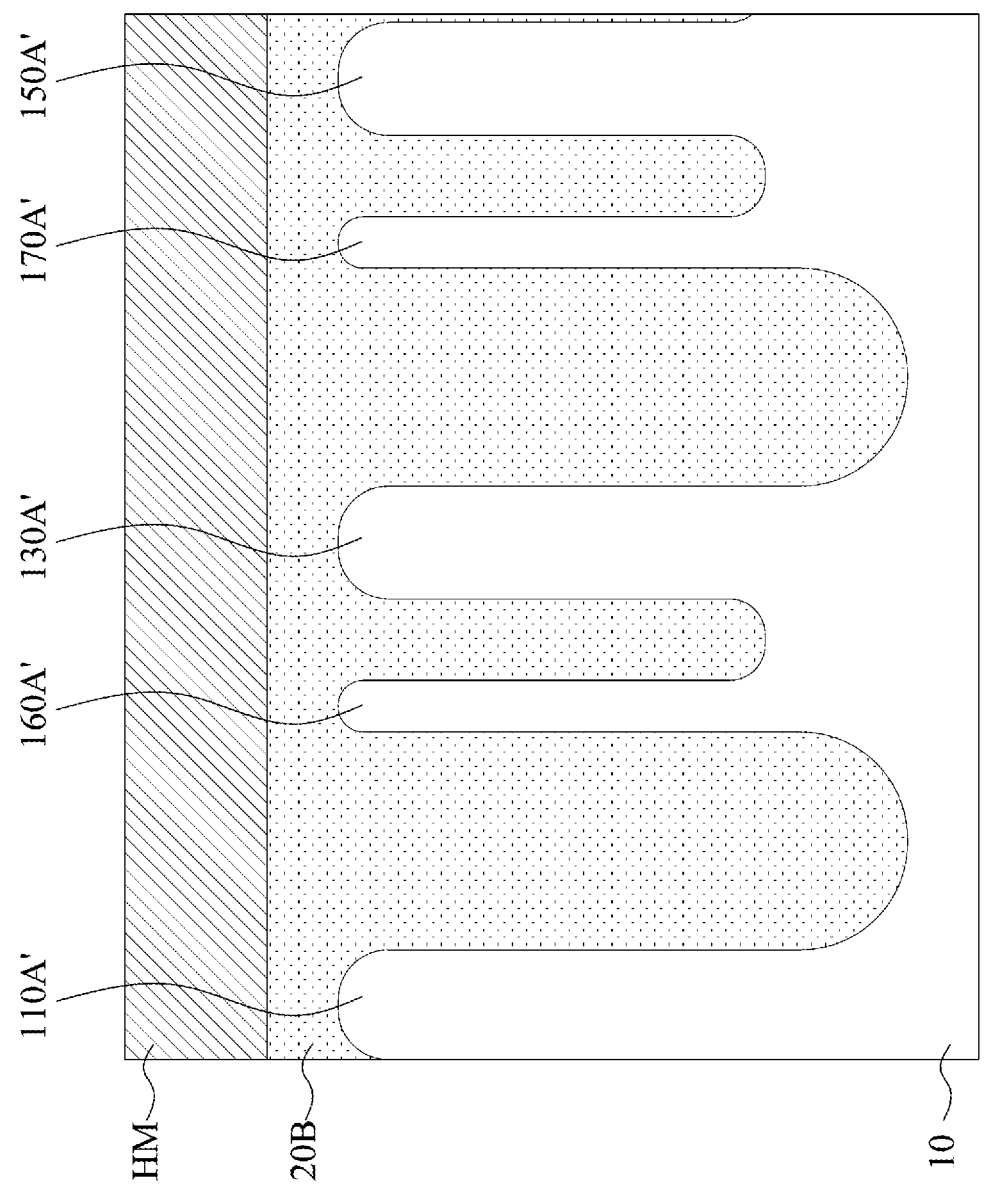
FIG. 3B is a cross-section illustrating one stage of a method of manufacturing a semiconductor structure, in accordance with some embodiments of the present disclosure.

Referring to FIGS. 3, 3A, and 3B, FIG. 3 is a top view illustrating one stage of a method of manufacturing a semiconductor structure 1, in accordance with some embodiments of the present disclosure, FIG. 3A is a cross-section illustrating one stage of a method of manufacturing a semiconductor structure 1, in accordance with some embodiments of the present disclosure, and FIG. 3B is a cross-section illustrating one stage of a method of manufacturing a semiconductor structure 1, in accordance with some embodiments of the present disclosure. In some embodiments, FIG. 3A is a cross-section along line 3A-3A' of FIG. 3, and FIG. 3B is a cross-section along line 3B-3B' of FIG. 3.

A removal operation E1 may be performed on the initial fin structures 110A, 120A, 130A, 140A, and 150A of the semiconductor substrate 10 and the isolation material 20A to form a plurality of trenches 30A. In some embodiments, the removal operation is performed on the initial fin structures 110A, 120A, 130A, 140A, and 150A of the semiconductor substrate 10 and the isolation material 20A to form a plurality of fins (e.g., fins 110, 120, 130, 140, and 150) in the trench 30A and an isolation layer 20B surrounding the plurality of fins. In some embodiments, an elevational difference D5 between a top surface (e.g., a top surface 120a) of the fins (e.g., the fin 120) and a top surface 201B of the isolation layer 20B is less than about 10 nm. In some embodiments, an elevational difference D5 between a top surface (e.g., a top surface 120a) of the fins (e.g., the fin 120) and a top surface 201B of the isolation layer 20B is less than about 5 nm. In some embodiments, an elevational difference D5 between a top surface (e.g., a top surface 120a) of the fins (e.g., the fin 120) and a top surface 201B of the isolation layer 20B is less than about 3 nm.

In some embodiments, the removal operation E1 may be or include performing an anisotropic etching operation on the initial fin structures 110A, 120A, 130A, 140A, and 150A of the semiconductor substrate 10 and the isolation material 20A to form a plurality of trenches 30A. In some embodiments, the removal operation E1 may be or include performing an anisotropic etching operation on the initial fin structures 110A, 120A, 130A, 140A, and 150A of the semiconductor substrate 10 and the isolation material 20A to form the fins 110, 120, 130, 140, and 150 in the trench 30A.

In some embodiments, the anisotropic etching operation is performed according to the patterned hard mask HM. In some embodiments, the anisotropic etching operation includes a dry etching operation. In some embodiments, the dry etch process includes such as plasma etching or reactive ion etching. In some embodiments, the dry etch process may use HBr and $O_2$ as an etching gas. In some embodiments, the dry etch process may use $CF_4/O_2/Ar$ as an etching gas. In some embodiments, the anisotropic etching operation removes portions of the initial fin structures 110A, 120A, 130A, 140A, and 150A to form the fins 110, 120, 130, 140, and 150. In some embodiments, the anisotropic etching operation removes a portion of the isolation material 20 to form the isolation layer 20B.

As shown in FIG. 3A, a reference line 20A1 may indicate the elevation or the location of the top surface of the isolation material 20A before the removal operation E1, and reference lines 110a1 and 120a1 may indicate the elevations or the locations of the top surfaces of the initial fin structures 110A and 120A. In some embodiments, the portion of the isolation material 20A removed by the removal operation E1 has a thickness D6. In some embodiments, the portion of the initial fin structure 110A removed by the removal operation E1 and the portion of the initial fin structure 120A removed by the removal operation E1 have a thickness D4.

As shown in FIG. 3B, remaining portions of the initial fin structures 110A, 120A, 130A, 140A, and 150A under the patterned hardmask HM may form structures 110A' 120A', 130A', 140A', and 150A' after the removal operation E1.

Figure 4:
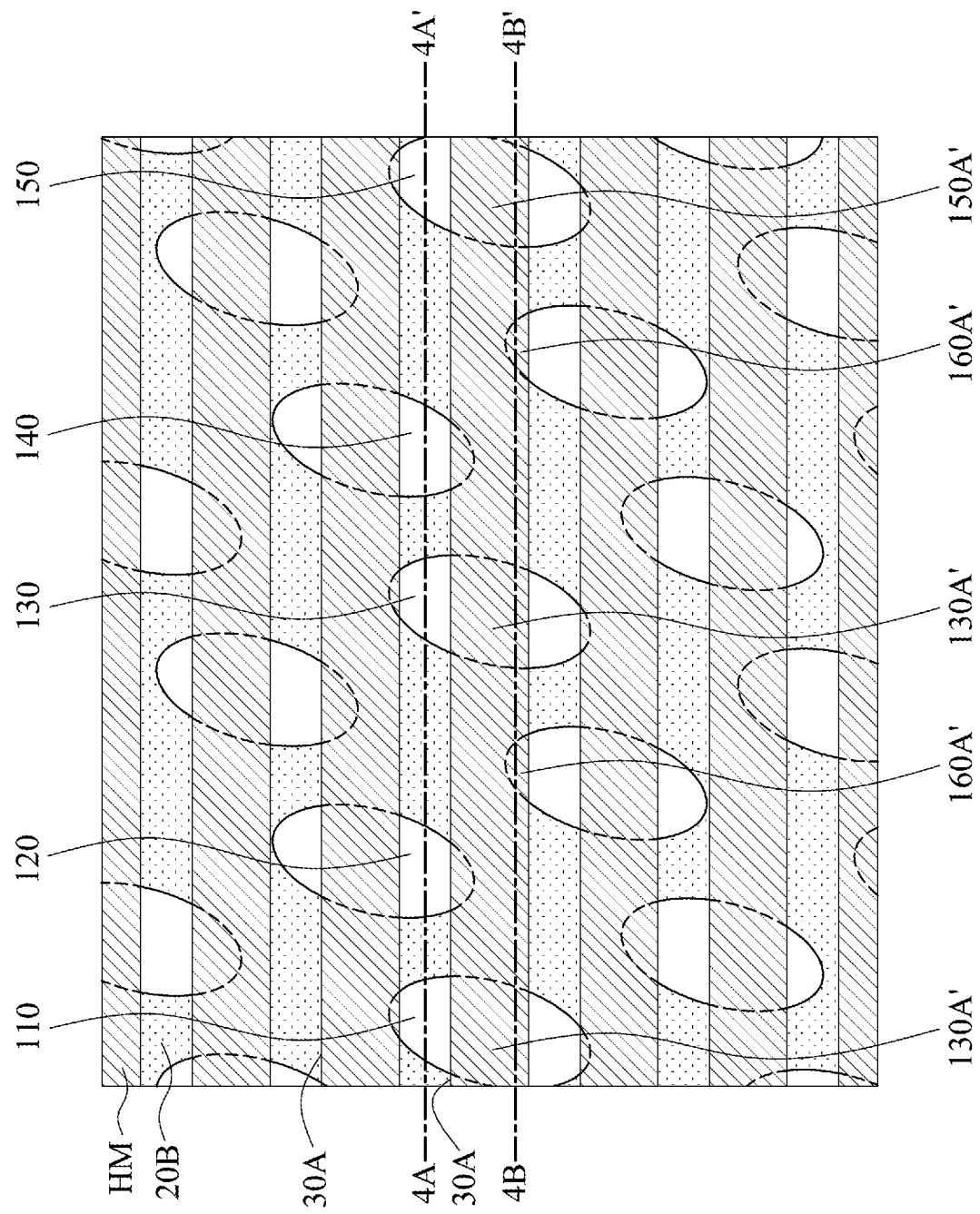
FIG. 4 is a top view illustrating one stage of a method of manufacturing a semiconductor structure, in accordance with some embodiments of the present disclosure.
Figure 4A:
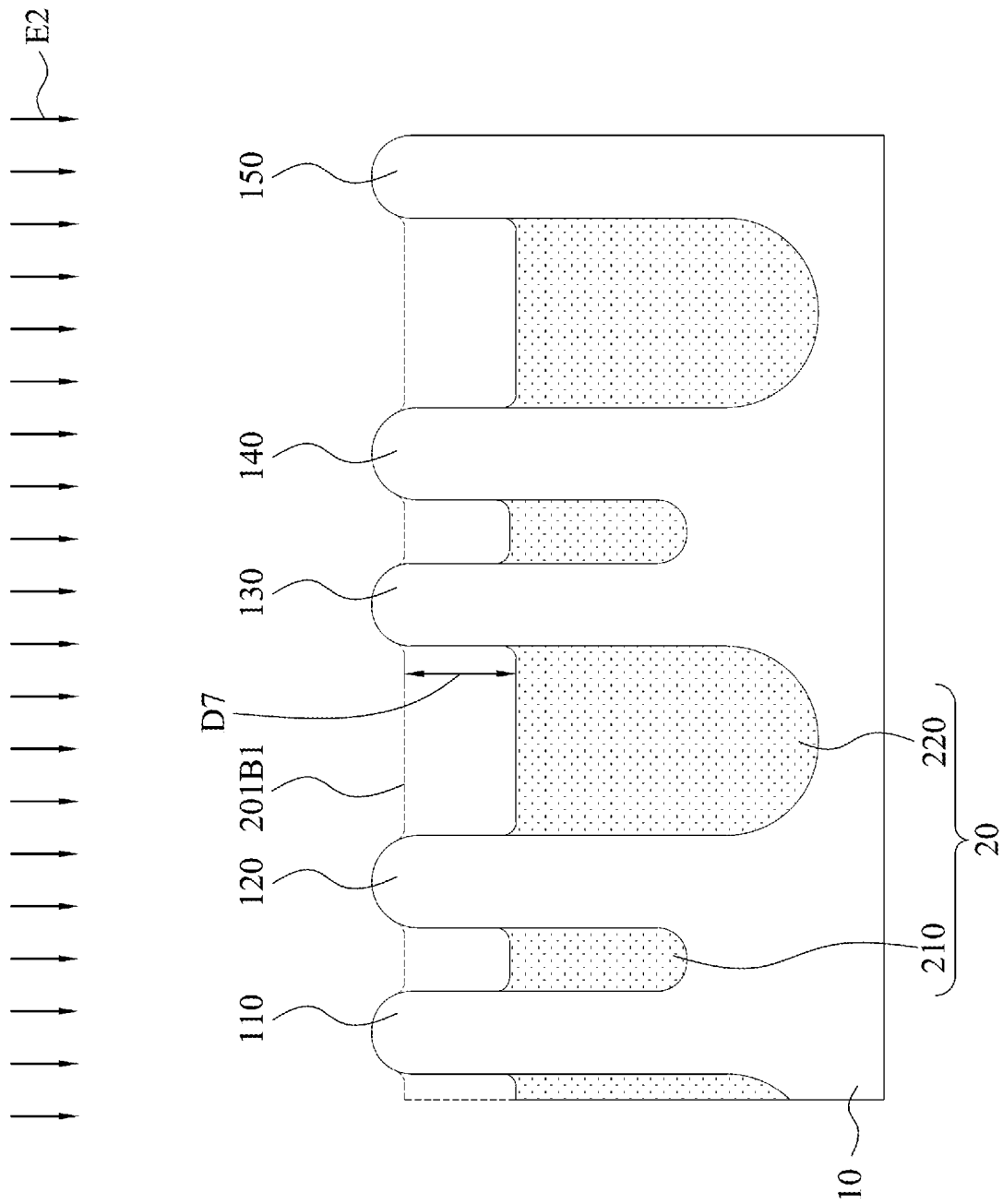
FIG. 4A is a cross-section illustrating one stage of a method of manufacturing a semiconductor structure, in accordance with some embodiments of the present disclosure.
Figure 4B:
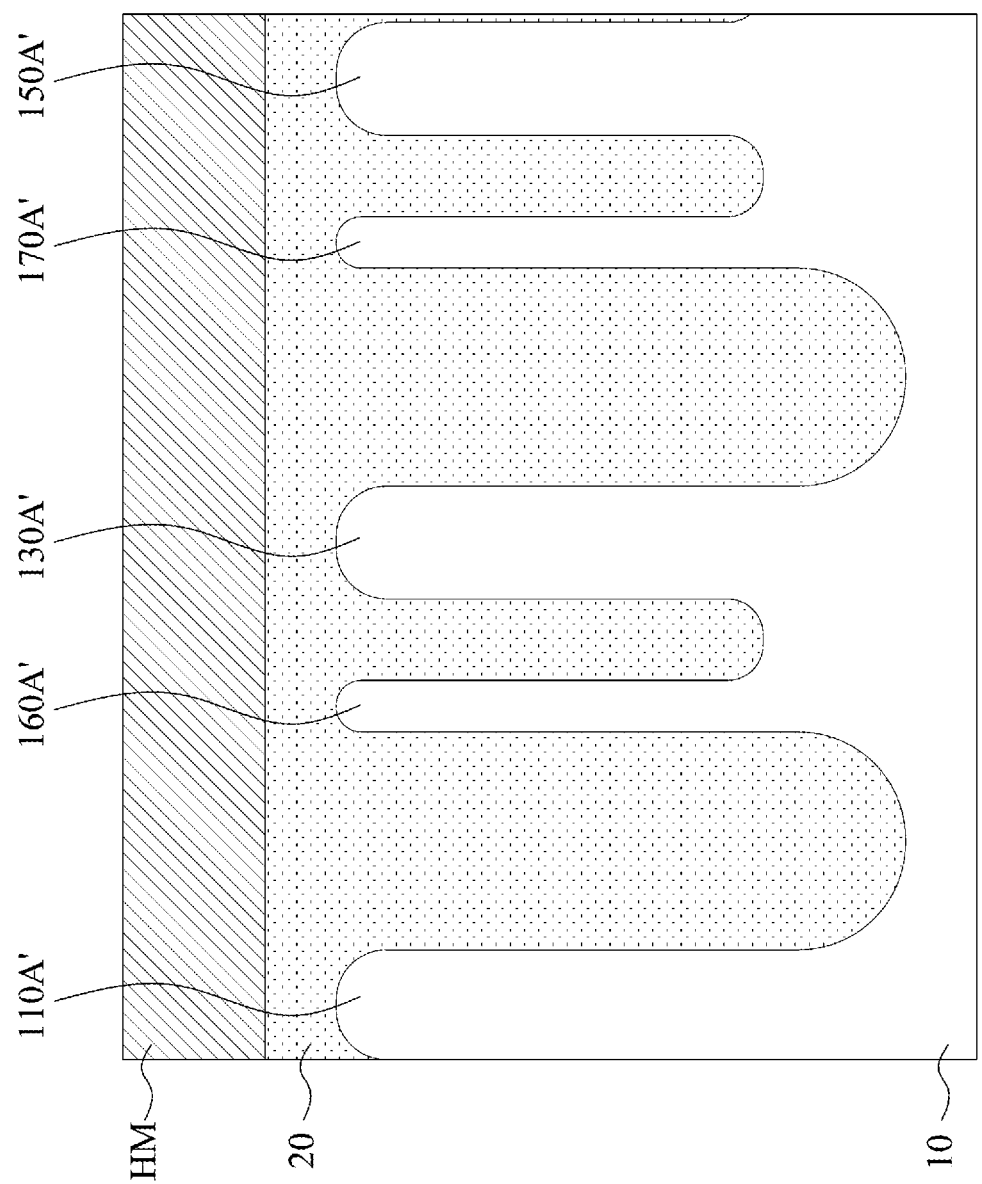
FIG. 4B is a cross-section illustrating one stage of a method of manufacturing a semiconductor structure, in accordance with some embodiments of the present disclosure.

Referring to FIGS. 4, 4A, and 4B, FIG. 4 is a top view illustrating one stage of a method of manufacturing a semiconductor structure 1, in accordance with some embodiments of the present disclosure, FIG. 4A is a cross-section illustrating one stage of a method of manufacturing a semiconductor structure 1, in accordance with some embodiments of the present disclosure, and FIG. 4B is a cross-section illustrating one stage of a method of manufacturing a semiconductor structure 1, in accordance with some embodiments of the present disclosure. In some embodiments, FIG. 4A is a cross-section along line 4A-4A' of FIG. 4, and FIG. 4B is a cross-section along line 4B-4B' of FIG. 4.

A removal operation E2 may be performed on the isolation layer 20B to form an isolation structure 20 surrounding the fins 110, 120, 130, 140, and 150. In some embodiments, a top surface of the isolation structure 20 is below the top surface of the 110, 120, 130, 140, and 150 by about 20 nm to about 40 nm. In some embodiments, a top surface of the isolation structure 20 is below the top surface of the 110, 120, 130, 140, and 150 by about 25 nm to about 35 nm.

In some embodiments, the elevational difference D5 between the top surface of the fins 110, 120, 130, 140, and 150 and the top surface 201B of the isolation layer 20B is less than about 5 nm prior to the removal operation E2. In some embodiments, the top surface of the isolation structure 20 is below the top surface of the plurality of fins 110, 120, 130, 140, and 150 by about 20 nm to about 40 nm after the removal operation E2. In some embodiments, the top surface of the isolation structure 20 is below the top surface of the plurality of fins 110, 120, 130, 140, and 150 by about 25 nm to about 35 nm after the removal operation E2.

In some embodiments, the removal operation E2 may be or include performing an isotropic etching operation on the isolation material 20B to form the isolation structure 20. In some embodiments, the isotropic etching operation includes a wet etching operation. In some embodiments, an etchant of the wet etching operation includes a fluorine-containing etchant. In some embodiments, hydrofluoric acid is used as the etchant in the wet etching operation. In some embodiments, diluted hydrofluoric acid (DHF 200:1) is used as the etchant in the wet etching operation. In some embodiments, the wet etching operation (i.e., the removal operation E2) is highly selective to the fins 110, 120, 130, 140, and 150 with respect to the isolation layer 20B. In some embodiments, the fins 110, 120, 130, 140, and 150 are barely or even substantially not removed or etched by the removal operation E2.

In some embodiments, the isotropic etching operation (i.e., the removal operation E2) removes a portion of the isolation layer 20B to form the isolation structure 20 exposing the fins 110, 120, 130, 140, and 150. In some embodiments, the isotropic etching operation (i.e., the removal operation E2) is performed for about 10 seconds to about 40 seconds. In some embodiments, the isotropic etching operation (i.e., the removal operation E2) is performed for about 20 seconds to about 30 seconds. In some embodiments, the isotropic etching operation (i.e., the removal operation E2) is performed for less than about 60 seconds. In some embodiments, the isotropic etching operation (i.e., the removal operation E2) is performed for a time period shorter than that of the anisotropic etching operation (i.e., the removal operation E1). In some embodiments, the isotropic etching operation (i.e., the removal operation E2) is performed for a time period long enough to define the fin heights of the fins 110, 120, 130, 140, and 150. In some embodiments, the isotropic etching operation (i.e., the removal operation E2) is performed for a time period short enough to prevent over-etching structures and/or elements other than the isolation layer 20B.

In some embodiments, the removal operation E2 is performed after the removal operation E1. In some embodiments, the isotropic etching operation (i.e., the removal operation E2) is performed after the anisotropic etching operation (i.e., the removal operation E1). In some embodiments, the anisotropic etching operation (i.e., the removal operation E1) and the isotropic etching operation (i.e., the removal operation E2) are both performed according to the patterned hard mask HM.

As shown in FIG. 4A, a reference line 201B1 may indicate the elevation or the location of the top surface of the isolation layer 20B before the removal operation E2. In some embodiments, the portion of the isolation layer 20B removed by the removal operation E2 has a thickness D7. In some embodiments, the thickness D7 is about 20 nm to about 40 nm. In some embodiments, the thickness D7 is about 25 nm to about 35 nm. In some embodiments, the thickness D7 is substantially equal to a predetermined fin height. In some embodiments, the removal operation E2 removing a portion of the isolation layer 20B defines the fin height of the fins 110, 120, 130, 140, and 150 in the trench 30A.

Figure 5:
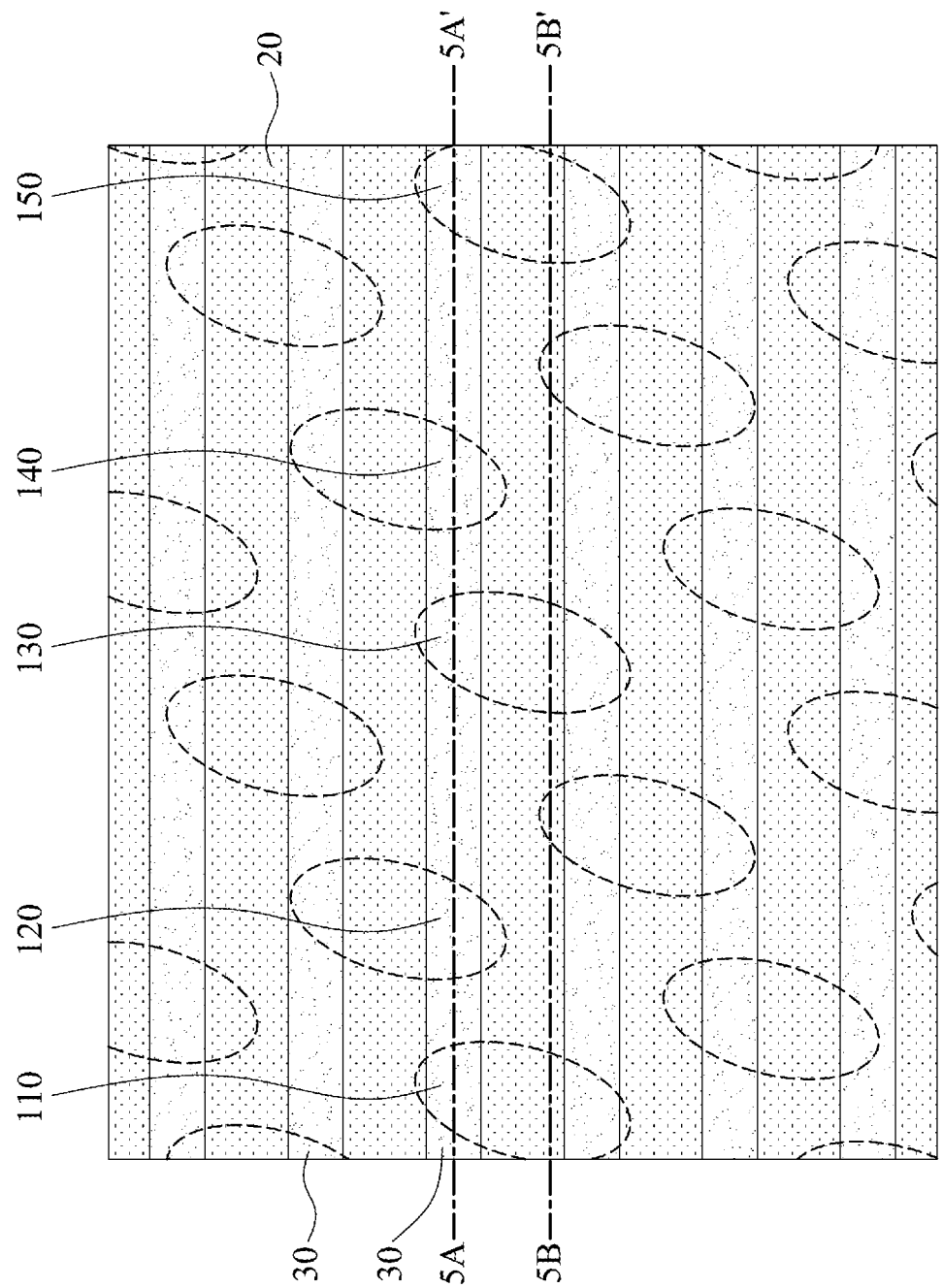
FIG. 5 is a top view illustrating one stage of a method of manufacturing a semiconductor structure, in accordance with some embodiments of the present disclosure.
Figure 5A:
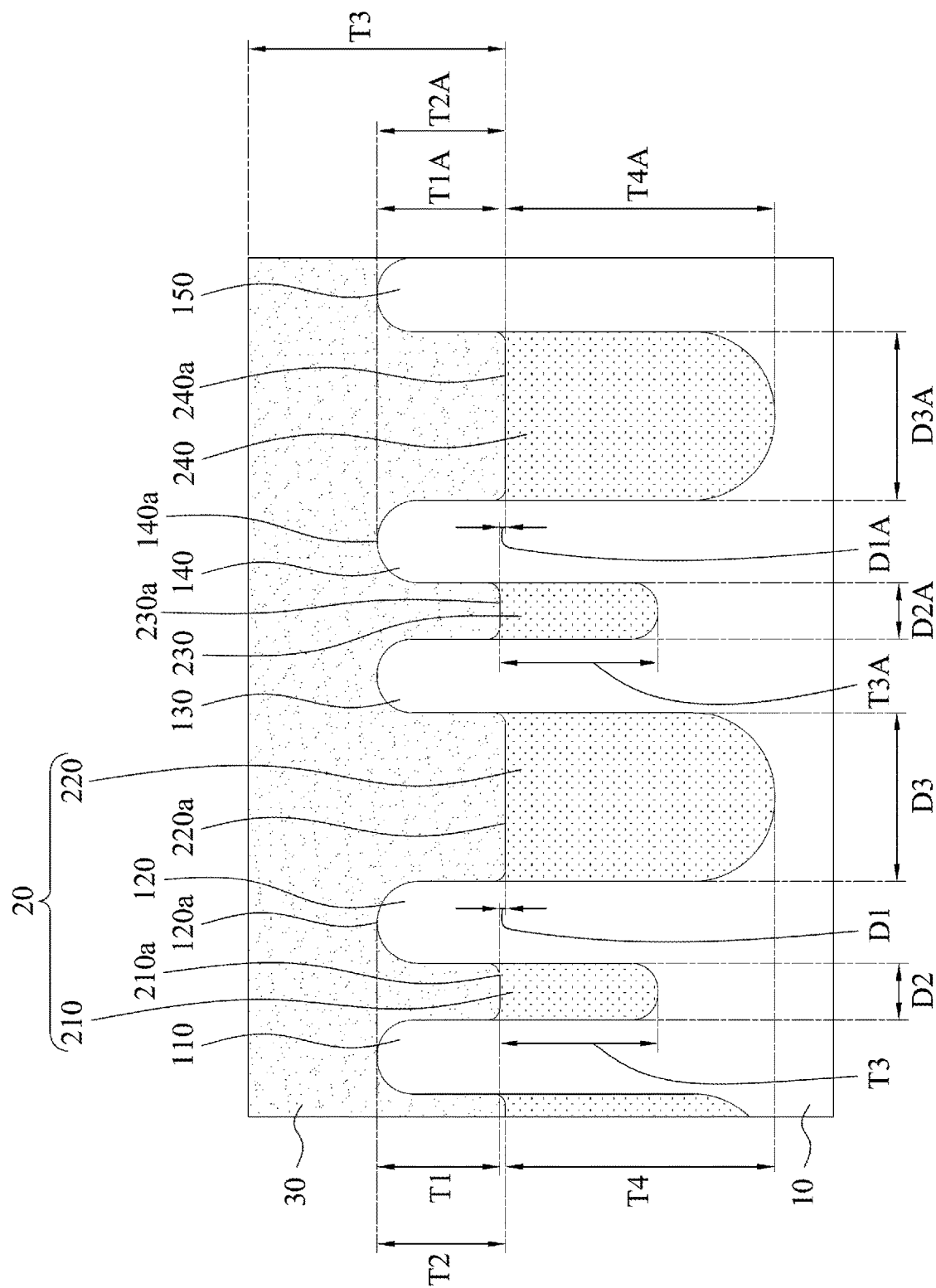
FIG. 5A is a cross-section illustrating one stage of a method of manufacturing a semiconductor structure, in accordance with some embodiments of the present disclosure.
Figure 5B:
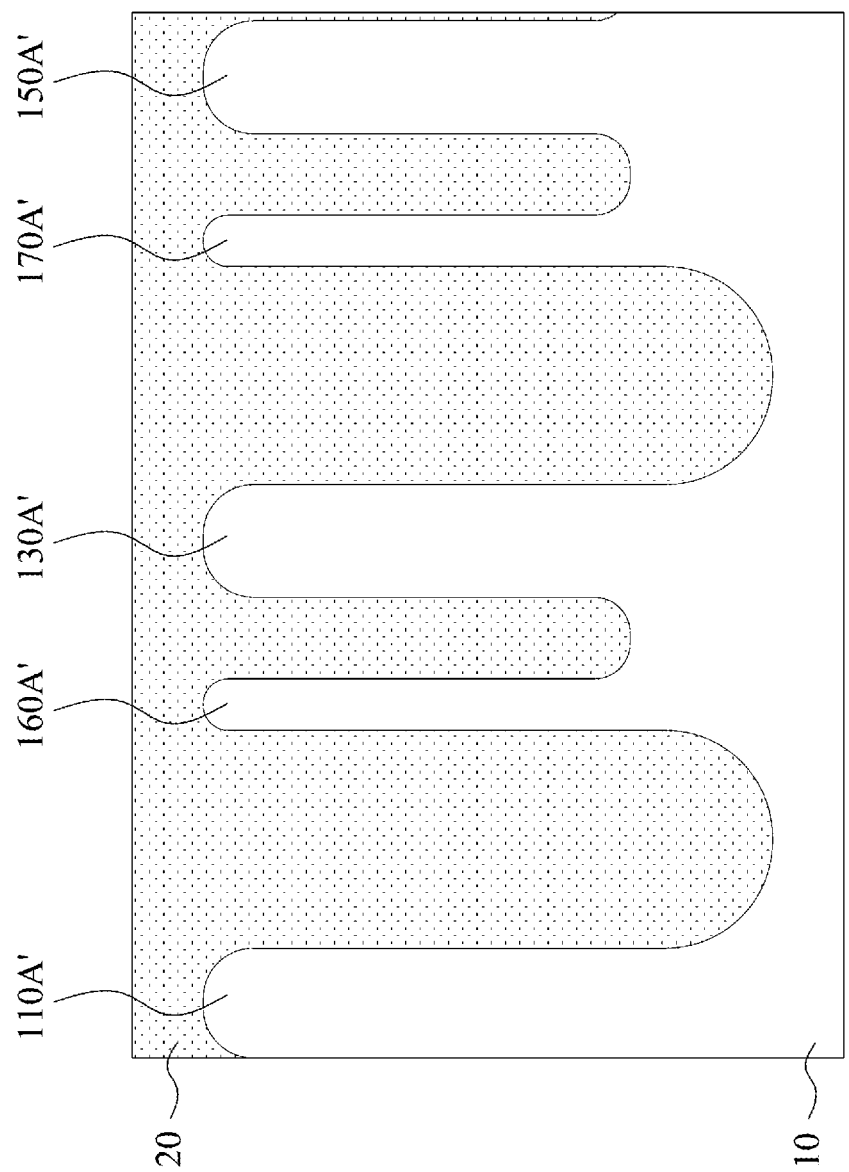
FIG. 5B is a cross-section illustrating one stage of a method of manufacturing a semiconductor structure, in accordance with some embodiments of the present disclosure.

Referring to FIGS. 5, 5A, and 5B, FIG. 5 is a top view illustrating one stage of a method of manufacturing a semiconductor structure 1, in accordance with some embodiments of the present disclosure, FIG. 5A is a cross-section illustrating one stage of a method of manufacturing a semiconductor structure 1, in accordance with some embodiments of the present disclosure, and FIG. 5B is a cross-section illustrating one stage of a method of manufacturing a semiconductor structure 1, in accordance with some embodiments of the present disclosure. In some embodiments, FIG. 5A is a cross-section along line 5A-5A' of FIG. 5, and FIG. 5B is a cross-section along line 5B-5B' of FIG. 5.

In some embodiments, one or more conductive elements 30 may be formed on the fins 110, 120, 130, 140, and 150. In some embodiments, one or more conductive elements 30 may be formed on the fins 110, 120, 130, 140, and 150 in the trenches 30A. In some embodiments, one or more conductive elements 30 may be formed on the isolation structure 20 in the trenches 30A.

According to some embodiments of the present disclosure, the removal operation E1 includes an isotropic etching operation (or a directional operation), and thus the fins and the isolation layer can be formed with top surfaces at substantially the same elevation in the trench defined by the patterned hardmask. Therefore, the removal operation E2 may be used to precisely define fin heights.

In addition, according to some embodiments of the present disclosure, the removal operation E2 includes an isotropic etching operation (e.g., a wet etching operation), and thus the flowability of the liquid phase of the etchant can allow the etchant to penetrate through small features (e.g., the isolation portion between two fins that are relatively close to each other). Therefore, the etching uniformity is significantly increased, and thus the isolation portions between fins can be etched away by substantially equal heights or amounts, thereby the uniformity of the as-formed fin heights can be significantly increased.

Moreover, according to some embodiments of the present disclosure, the formation of the fins and the isolation structure includes a dry etching operation for removing relatively large portions of the initial fin structures and the isolation material and a wet etching operation for further removing a portion of the isolation material (or the isolation layer) to define the fin height. Therefore, since the wet etching operation is merely responsible for removing a relatively small portion of the isolation material (or the isolation layer) to define the fin height, the time period for performing the wet etching can be relatively short, and over-etching of structures and/or elements other than the isolation material (or the isolation layer) can be further prevented.

Figure 6:
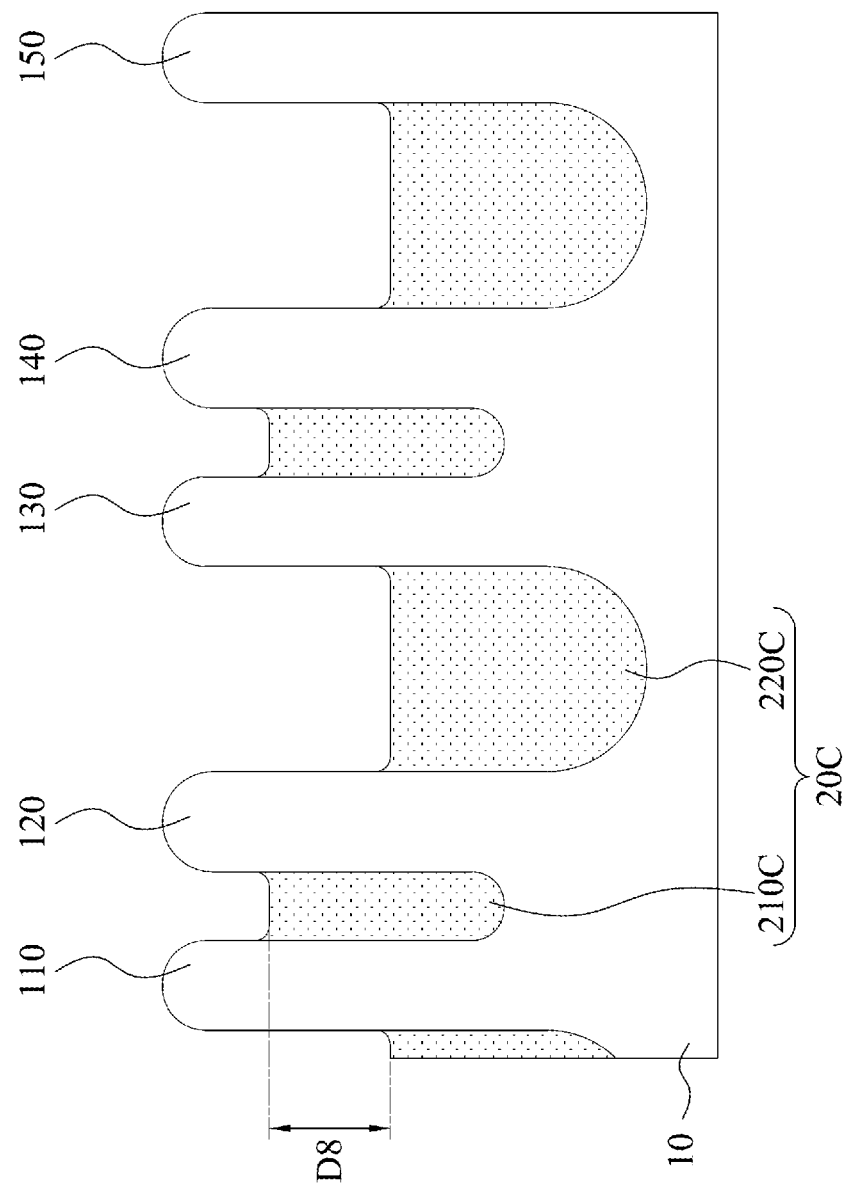
FIG. 6 is a cross-section illustrating one stage of a method of manufacturing a semiconductor structure, in accordance with some embodiments of the present disclosure.

FIG. 6 is a cross-section illustrating one stage of a method of manufacturing a semiconductor structure, in accordance with some embodiments of the present disclosure.

Figure 7:
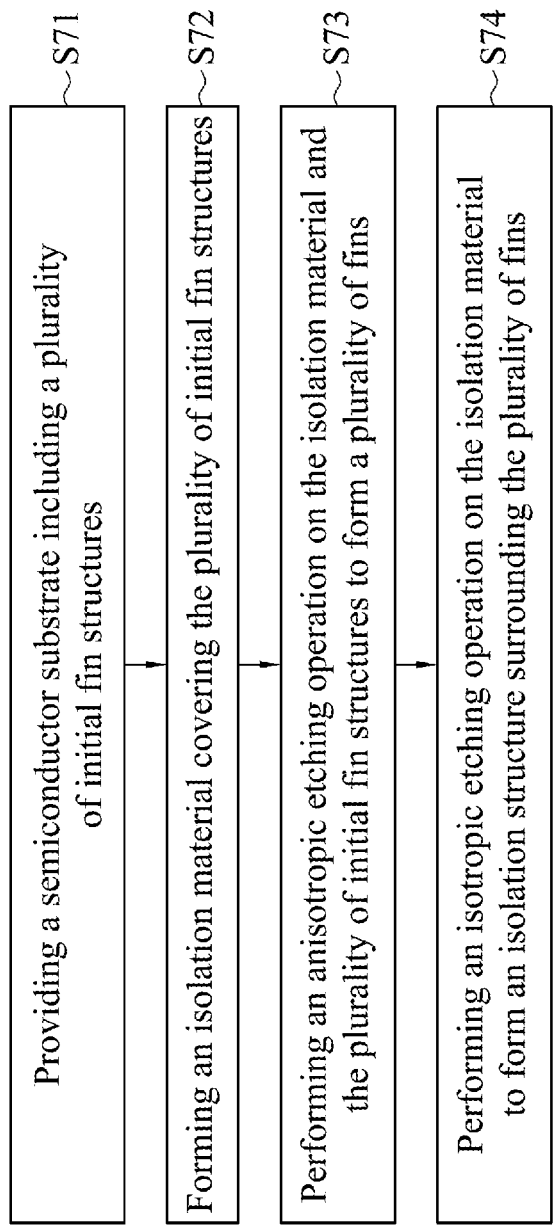
FIG. 7 is a flowchart illustrating a method of manufacturing a semiconductor structure, in accordance with some embodiments of the present disclosure.

In some embodiments, after the removal operation E1 is performed, an additional removal operation E1 (e.g., an anisotropic etching operation) is performed on the structure illustrated in FIGS. 3, 3A, and 3B rather than performing an isotropic operation (or a removal operation E2), an isolation structure 20C including a portion 210C and a portion 220C on opposite sides of the fin 120 may be formed. In some embodiments, an elevation difference D8 between the top surface of the portion 210C and the top surface of the portion 220C may be relatively large due to the loading effects. While the fin height of the fins 110 and 120 defined by the portion 210C of the isolation structure 20C is relatively short, the transistors including the fins 110 and 120 may be undesirably turned on when applied with a relatively low voltage or even some negative charges pass between the fins 110 and 120. Therefore, the semiconductor structure (e.g., the transistors including the fins 110 and 120) formed by a method including a stage illustrated in FIG. 6 may have an unsatisfactory performance, for example, having a low on-off sensitivity FIG. 7 is a flowchart illustrating a method 70 of manufacturing a semiconductor structure, in accordance with some embodiments of the present disclosure.

The method 70 begins with operation S71 in which a semiconductor substrate including a plurality of initial fin structures is provided.

The method 70 continues with operation S72 in which an isolation material covering the plurality of initial fin structures is formed.

The method 70 continues with operation S73 in which an anisotropic etching operation is performed on the isolation material and the plurality of initial fin structures to form a plurality of fins.

The method 70 continues with operation S74 in which an isotropic etching operation is performed on the isolation material to form an isolation structure surrounding the plurality of fins.

The method 70 is merely an example, and is not intended to limit the present disclosure beyond what is explicitly recited in the claims. Additional operations can be provided before, during, or after each operations of the method 70, and some operations described can be replaced, eliminated, or moved around for additional embodiments of the method. In some embodiments, the method 70 can include further operations not depicted in FIG. 7. In some embodiments, the method 70 can include one or more operations depicted in FIG. 7.

Figure 8:
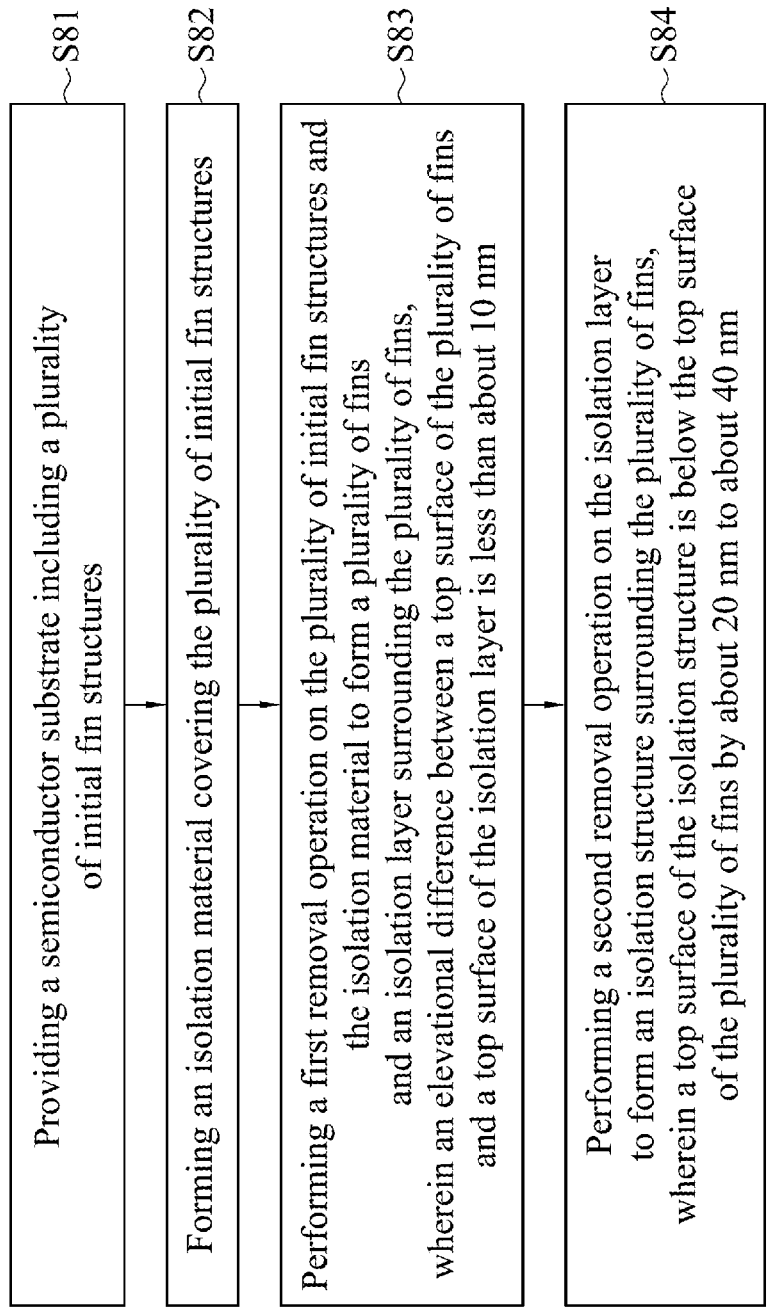
FIG. 8 is a flowchart illustrating a method of manufacturing a semiconductor structure, in accordance with some embodiments of the present disclosure.

FIG. 8 is a flowchart illustrating a method 80 of manufacturing a semiconductor structure, in accordance with some embodiments of the present disclosure.

The method 80 begins with operation S81 in which a semiconductor substrate including a plurality of initial fin structures is provided.

The method 80 continues with operation S82 in which an isolation material covering the plurality of initial fin structures is formed.

The method 80 continues with operation S83 in which a first removal operation is performed on the plurality of initial fin structures and the isolation material to form a plurality of fins and an isolation layer surrounding the plurality of fins. In some embodiments, an elevational difference between a top surface of the plurality of fins and a top surface of the isolation layer is less than about 10 nm The method 80 continues with operation S84 in which a second removal operation is performed on the isolation layer to form an isolation structure surrounding the plurality of fins. In some embodiments, a top surface of the isolation structure is below the top surface of the plurality of fins by about 20 nm to about 40 nm.

The method 80 is merely an example, and is not intended to limit the present disclosure beyond what is explicitly recited in the claims. Additional operations can be provided before, during, or after each operations of the method 80, and some operations described can be replaced, eliminated, or moved around for additional embodiments of the method. In some embodiments, the method 80 can include further operations not depicted in FIG. 8. In some embodiments, the method 80 can include one or more operations depicted in FIG. 8.

One aspect of the present disclosure provides a semiconductor structure. The semiconductor structure includes a semiconductor substrate and an isolation structure. The semiconductor substrate includes a first fin. The isolation structure defines the first fin. The isolation structure includes a first portion and a second portion on two opposite sides of the first fin. A difference between an elevation of a top surface of the first portion and an elevation of a top surface of the second portion is greater than 0 and less than about 5 nm.

Another aspect of the present disclosure provides a method of manufacturing a semiconductor structure. The method includes providing a semiconductor substrate including a plurality of initial fin structures. The method also includes forming an isolation material covering the plurality of initial fin structures. The method further includes performing an anisotropic etching operation on the isolation material and the plurality of initial fin structures to form a plurality of fins. The method also includes performing an isotropic etching operation on the isolation material to form an isolation structure surrounding the plurality of fins.

Another aspect of the present disclosure provides a method of manufacturing a semiconductor structure. The method includes providing a semiconductor substrate including a plurality of initial fin structures. The method also includes forming an isolation material covering the plurality of initial fin structures. The method further includes performing a first removal operation on the plurality of initial fin structures and the isolation material to form a plurality of fins and an isolation layer surrounding the plurality of fins. An elevational difference between a top surface of the plurality of fins and a top surface of the isolation layer is less than about 10 nm. The method also includes performing a second removal operation on the isolation layer to form an isolation structure surrounding the plurality of fins, wherein a top surface of the isolation structure is below the top surface of the plurality of fins by about 20 nm to about 40 nm.

In the method of manufacturing the semiconductor structure, the formation of fins and an isolation structure defining the fins includes a dry etching operation for removing relatively large portions of initial fin structures and an isolation material and a wet etching operation for further removing a portion of the isolation material (or the isolation layer) to define the fin height. The flowability of the liquid phase of an etchant of the wet etching operation can allow the etchant to penetrate through small features (e.g., the isolation portion between two fins that are relatively close to each other). Therefore, the etching uniformity is significantly increased, and thus the isolation portions between fins can be etched away by substantially equal heights or amounts, thereby the uniformity of the as-formed fin heights can be significantly increased. In addition, the time period for performing the wet etching can be relatively short, and over-etching of structures and/or elements other than the isolation material (or the isolation layer) can be further prevented.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
    providing a semiconductor substrate comprising a plurality of initial fin structures;
    forming an isolation material covering the plurality of initial fin structures;
    performing an anisotropic etching operation on the plurality of initial fin structures and the isolation material to remove top portions of the plurality of initial fin structures and a top portion of the isolation material to form a plurality of fins and an isolation layer surrounding the plurality of fins, wherein an elevational difference between a top surface of the plurality of fins and a top surface of the isolation layer is less than about 10 nm; and
    after performing the anisotropic etching operation, performing an isotropic etching operation on the isolation layer to selectively remove a top portion of the isolation layer to form an isolation structure surrounding the plurality of fins, wherein the plurality of fins are not removed or etched by the isotropic etching operation, wherein an etchant of the isotropic etching operation includes a fluorine-containing etchant, wherein a top surface of the isolation structure is below the top surface of the plurality of fins by about 20 nm to about 40 nm.

2. The method of claim 1, wherein the elevational difference between the top surface of the plurality of fins and the top surface of the isolation layer is less than about 5 nm prior to the isotropic etching operation.

3. The method of claim 1, wherein the top surface of the isolation structure is below the top surface of the plurality of fins by about 25 nm to about 35 nm after the isotropic etching operation.

4. The method of claim 1, wherein the anisotropic etching operation comprises a dry etching operation, and the isotropic etching operation comprises a wet etching operation.

5. The method of claim 1, wherein the isotropic etching operation is performed for about 10 seconds to about 40 seconds.

6. The method of claim 5, wherein the isotropic etching operation is performed for about 20 seconds to about 30 seconds.

7. The method of claim 1, wherein the semiconductor substrate comprises silicon, and the isolation material comprises silicon oxide.

8. The method of claim 1, further comprising:
    forming a conductive element on the plurality of fins and the isolation structure.

* * * * *